(12) United States Patent
Lee

(10) Patent No.: US 7,990,232 B1
(45) Date of Patent: Aug. 2, 2011

(54) ANCHOR/SUPPORT DESIGN FOR MEMS RESONATORS

(75) Inventor: Seungbae Lee, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 191 days.

(21) Appl. No.: 12/133,934

(22) Filed: Jun. 5, 2008

Related U.S. Application Data

(60) Provisional application No. 60/942,265, filed on Jun. 6, 2007.

(51) Int. Cl.
*H03H 9/02* (2006.01)
*H03H 9/46* (2006.01)

(52) U.S. Cl. .................................. 333/186; 333/199

(58) Field of Classification Search .................. 333/186, 333/197–199, 219; 310/309
See application file for complete search history.

(56) References Cited

U.S. PATENT DOCUMENTS

| | | | | |
|---|---|---|---|---|
| 6,713,938 | B2* | 3/2004 | Nguyen | 310/309 |
| 6,870,444 | B1 | 3/2005 | Zurcher et al. | |
| 6,985,051 | B2* | 1/2006 | Nguyen et al. | 333/186 |
| 7,323,952 | B2* | 1/2008 | Pan et al. | 333/186 |
| 7,595,708 | B2* | 9/2009 | Lutz et al. | 333/186 |
| 2005/0024165 | A1* | 2/2005 | Hsu | 333/186 |

FOREIGN PATENT DOCUMENTS

WO 2006/067757 A1 6/2006

OTHER PUBLICATIONS

Chandrahalim, Hengky et al., "Channel-Select Micromechanical Filters Using High-K Dielectrically Transduced MEMS Resonators," Proceedings of the 19th International IEEE Electro Mechanical Systems Conference, Jan. 22-26, 2006, pp. 894-897, IEEE, Istanbul, Turkey.
Kaajakari, Ville et al., "Square-Extensional Mode Single-Crystal Silicon Micromechanical Resonator for Low-Phase-Noise Oscillator Applications," IEEE Electron Device Leters, Apr. 2004, pp. 173-175, vol. 25, No. 4, IEEE.
Wang, Kun et al., "VHF Free-Free Beam High-Q Micromechanical Resonators," Journal of Microelectromechanical Systems, Sep. 2000, pp. 347-360, vol. 9, No. 3, IEEE.

* cited by examiner

*Primary Examiner* — Robert Pascal
*Assistant Examiner* — Alan Wong
(74) *Attorney, Agent, or Firm* — Withrow & Terranova, P.L.L.C.

(57) ABSTRACT

Micro-Electro-Mechanical Systems (MEMS) resonator designs having support structures that minimize or substantially reduce anchor losses, thereby improving a quality factor (Q) of the MEMS resonators, are provided. In general, a MEMS resonator includes a resonator body connected to anchors via support structures. The anchors are connected to or are part of a substrate on which the MEMS resonator is formed. The support structures operate to support the resonator body in free space to enable vibration. The support structures are designed to minimize or substantially reduce energy loss through the anchors into the substrate.

29 Claims, 14 Drawing Sheets

ANCHOR/SUPPORT DESIGN FOR MEMS RESONATORS

RELATED APPLICATIONS

This application claims the benefit of provisional patent application Ser. No. 60/942,265, filed Jun. 6, 2007, the disclosure of which is hereby incorporated by reference in its entirety.

FIELD OF THE INVENTION

The present invention relates to Micro-Electro-Mechanical Systems (MEMS) resonators and more specifically relates to anchor, or support, structures for MEMS resonators.

BACKGROUND OF THE INVENTION

Micro-Electrical-Mechanical Systems (MEMS) resonators have great potential for on-chip selective radio frequency (RF) applications such as oscillators and filters. One of the most important factors in MEMS resonator design is a quality factor (Q) of the MEMS resonator. The quality factor (Q) generally compares a resonant frequency of the MEMS resonator to a rate at which it dissipates energy. The frequency selectivity of the MEMS resonator is dependant on the quality factor (Q). The higher the quality factor (Q), the greater the frequency selectivity. Thus, a high quality factor (Q) is needed for applications in which frequency selectivity is required.

FIGS. 1 and 2 illustrate a conventional MEMS resonator 10 including a resonator body 12 connected to anchors 14 and 16 by support structures 18 and 20, respectively. The support structures 18 and 20 are more specifically support beams 18 and 20. The anchors 14 and 16 are either connected to or are part of a substrate 22. As illustrated in FIG. 2, the resonator body 12 and support beams 18 and 20 are separated from the substrate 22 by a gap 24 having some height (h). In the conventional MEMS resonator 10, the support beams 18 and 20 are each designed such that their lengths are exactly quarter-wavelength ($\lambda/4$), which is defined by the equation:

$$\frac{\lambda}{4} = \frac{1}{4 \cdot f_o} \sqrt{\frac{E_{\mathit{eff}}}{\rho_{\mathit{eff}}}},$$

where $f_O$ is a resonant frequency in Hertz of the resonator body 12, $E_{\mathit{eff}}$ is the Young's Modulus of the support beams 18 and 20, and $\rho_{\mathit{eff}}$ is a density of the support beams 18 and 20.

However, the conventional MEMS resonator 10 having the quarter-wavelength ($\lambda/4$) support beams 18 and 20 has several issues that limit its quality factor (Q) or result in a reduction in its quality factor (Q). One issue with the conventional MEMS resonator 10 that limits or reduces the quality factor (Q) is that there is a significant amount of vibrational energy at the anchor points of the support beams 18 and 20 that is dissipated through the anchors 14 and 16 into the substrate 22 when the conventional MEMS resonator 10 is in vibration mode. Note that the points at which the support beams 18 and 20 are connected to the anchors 14 and 16 are referred to herein as anchor points. FIG. 3 presents a modal analysis of the conventional MEMS resonator 10. In general, the quarter-wavelength ($\lambda/4$) support beams 18 and 20 do not vibrate with mechanically symmetric mode. For the quarter-wavelength ($\lambda/4$) support beams 18 and 20, a boundary condition is created (i.e., the anchor points are fixed with no vibration) in order to provide vibration at the desired frequency. If all boundary conditions are removed, the quarter-wavelength ($\lambda/4$) support beams 18 and 20 will not vibrate at the desired frequency of the conventional MEMS resonator 10.

The quarter-wavelength ($\lambda/4$) support beams 18 and 20 have maximum stress at the anchor points and, therefore, the anchors 14 and 16 must provide counter action in order for there to be no movement at the anchor points. In reality, the anchors 14 and 16 close to anchoring points are floating together with the resonator body 12 and the quarter-wavelength ($\lambda/4$) support beams 18 and 20 because of manufacturing issues. As a result, near the anchor points, the anchors 14 and 16 vibrate with some displacement in order to counter act with quarter-wavelength ($\lambda/4$) movement on the quarter-wavelength ($\lambda/4$) support beams 18 and 20. As a result, a significant amount of vibrational energy is dissipated through the anchors 14 and 16 into the substrate 22. The dissipation of energy through the anchors 14 and 16 into the substrate 22 is another anchor loss that limits or reduces the quality factor (Q) of the conventional MEMS resonator 10.

Another issue with the conventional MEMS resonator 10 is that the quarter-wavelength ($\lambda/4$) support beams 18 and 20 are relatively long. For example, for a desired resonant frequency ($f_O$), the length of the support beams 18 and 20 may be on the order of tens of microns. The relatively long support beams 18 and 20 raise fabrication issues and may further result in the resonator body 12 bending and touching the substrate 22, which would of course degrade the quality factor (Q) of the conventional MEMS resonator 10.

Thus, there is a need for an improved MEMS resonator that eliminates or reduces anchor losses, thereby improving a quality factor (Q) of the MEMS resonator.

SUMMARY OF THE INVENTION

The present invention provides Micro-Electro-Mechanical Systems (MEMS) resonators having support structures that minimize or substantially reduce anchor losses, thereby improving a quality factor (Q) of the MEMS resonators. In general, a MEMS resonator includes a resonator body connected to anchors via support structures. The anchors are connected to or are part of a substrate on which the MEMS resonator is formed. The support structures operate to support the resonator body in free space to enable vibration. The support structures are designed to minimize or substantially reduce energy loss through the anchors into the substrate.

In one embodiment, the support structures are mechanically symmetric support structures. More specifically, each of the mechanically symmetric support structures includes a mechanically symmetric support component and a coupling beam. The mechanically symmetric support component is coupled to the anchor, and the coupling beam has a first end coupled to the resonator body and a second end coupled to the mechanically symmetric support component. In addition, anchor points for the mechanically symmetric support component may be selected as nodal points on the mechanically symmetric support component at which there is essentially no vibration. As such, the mechanically symmetric support component vibrates as if does not experience any forced boundary condition. As a result, anchor losses are reduced and, therefore, the quality factor of the MEMS resonator is increased.

In another embodiment, the support structures include coupling beams having first ends connected to the resonator body and second ends connected directly or indirectly to the anchors. Unlike the support beams used in conventional MEMS resonators, a length of each of the coupling beams may be of any desired length and is not limited to being quarter-wavelength (λ/4). Each of the coupling beams may have a minimum length obtainable with the fabrication process used to fabricate the MEMS resonator. In another embodiment, each of the coupling beams may have a length that is substantially less than quarter-wavelength (λ/4). The support structures may additionally include mechanically symmetric support components. Each mechanically symmetric support component is coupled to the anchor, and the coupling beam has a first end coupled to the resonator body and a second end coupled to the mechanically symmetric support component. Further, anchor points for the mechanically symmetric support component may be selected as nodal points on the mechanically symmetric support component about which there is symmetric vibration when the MEMS resonator is in vibration mode and at which there is minimal or essentially no vibration when the MEMS resonator is in vibration mode. As a result of the mechanical symmetry of the support structure and the selection of the anchor points as the nodal points having minimal or essentially no vibration, anchor losses are reduced and, therefore, the quality factor of the MEMS resonator is increased.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 illustrates a conventional Micro-Electro-Mechanical Systems (MEMS) resonator having quarter-wavelength (λ/4) support structures;

FIG. 2 provides a cross-sectional view of the conventional MEMS resonator of FIG. 1;

Figure 8:
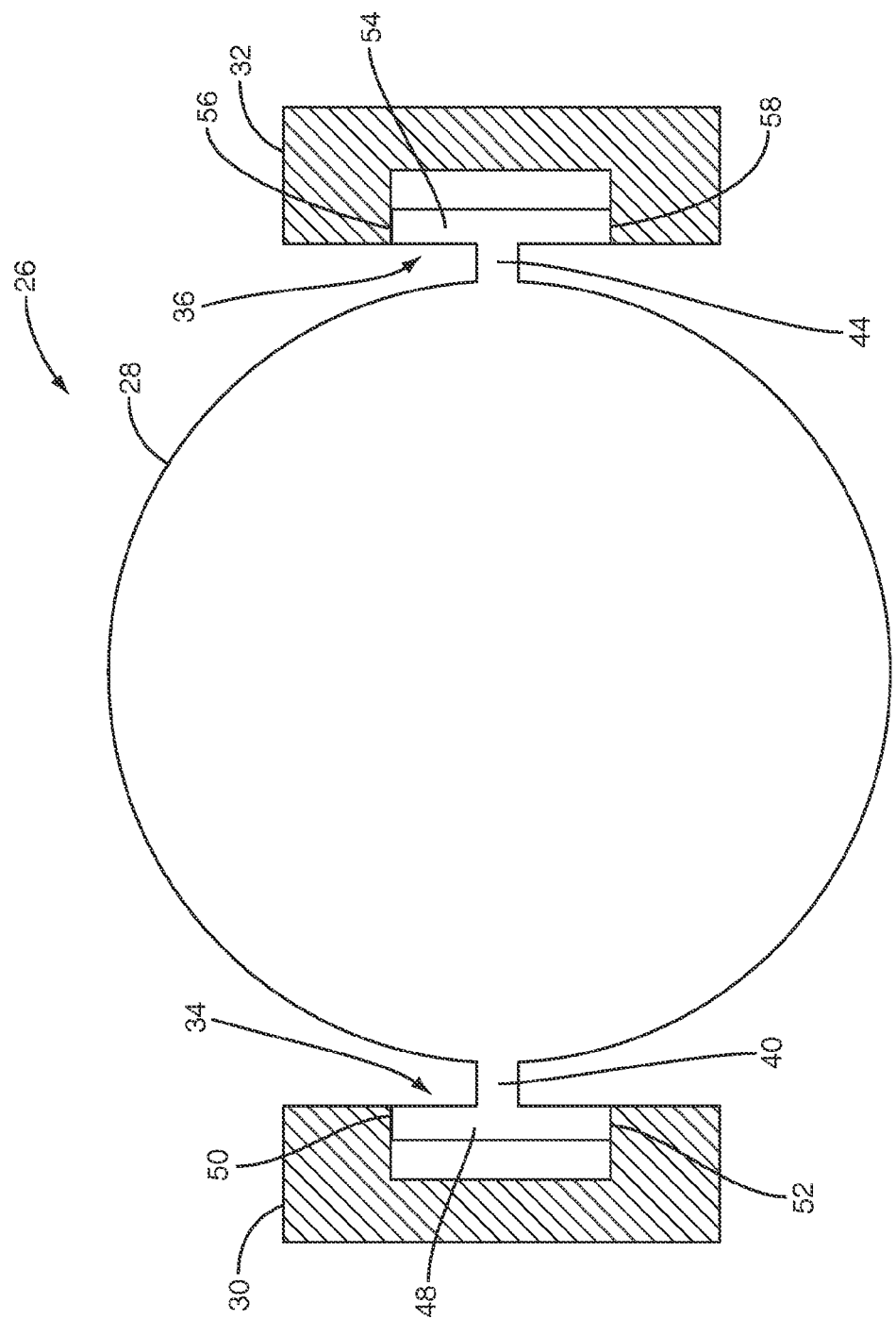
FIG. 8 illustrates an exemplary MEMS resonator having coupling beams of a length substantially shorter than quarter-wavelength (λ/4) according to a first embodiment of the present invention.
Figure 9:
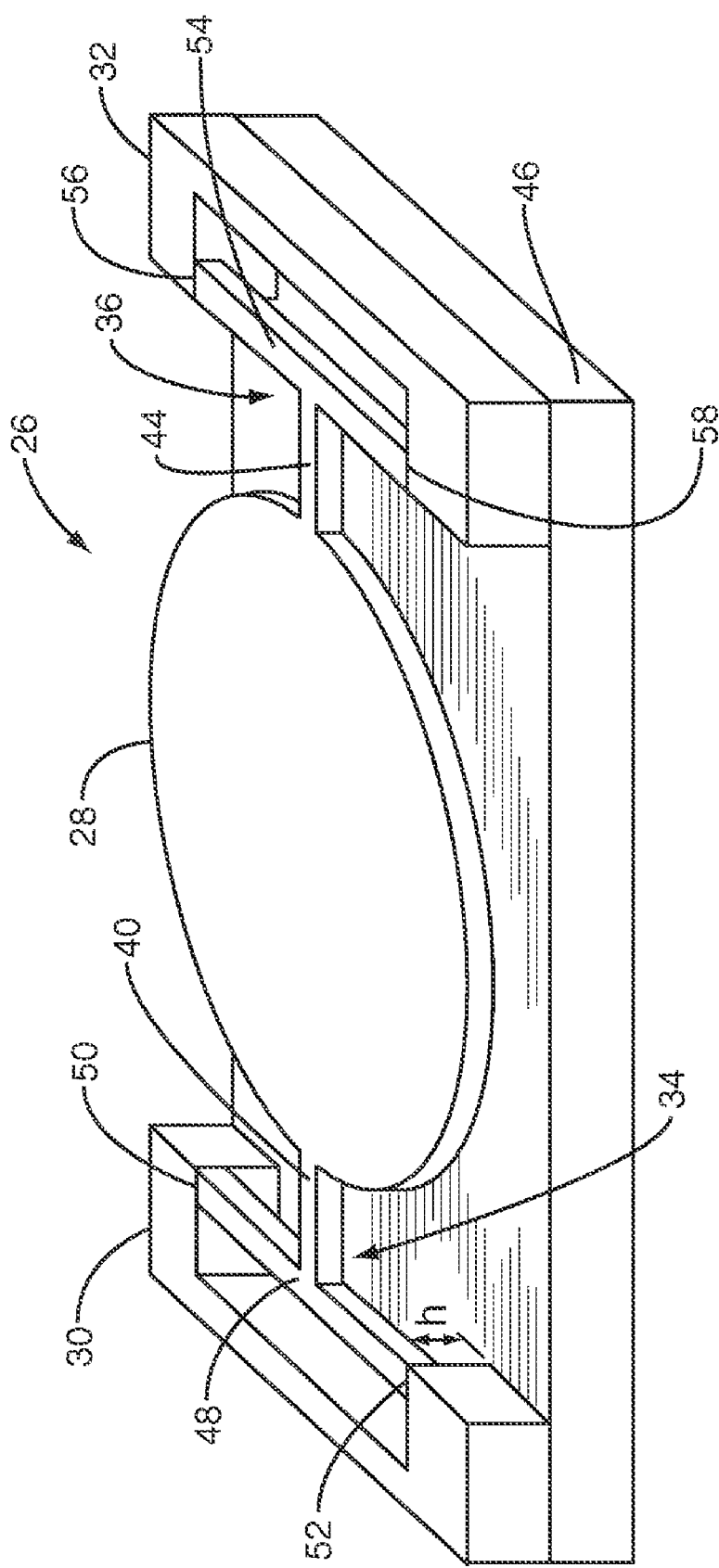
Figure 10:
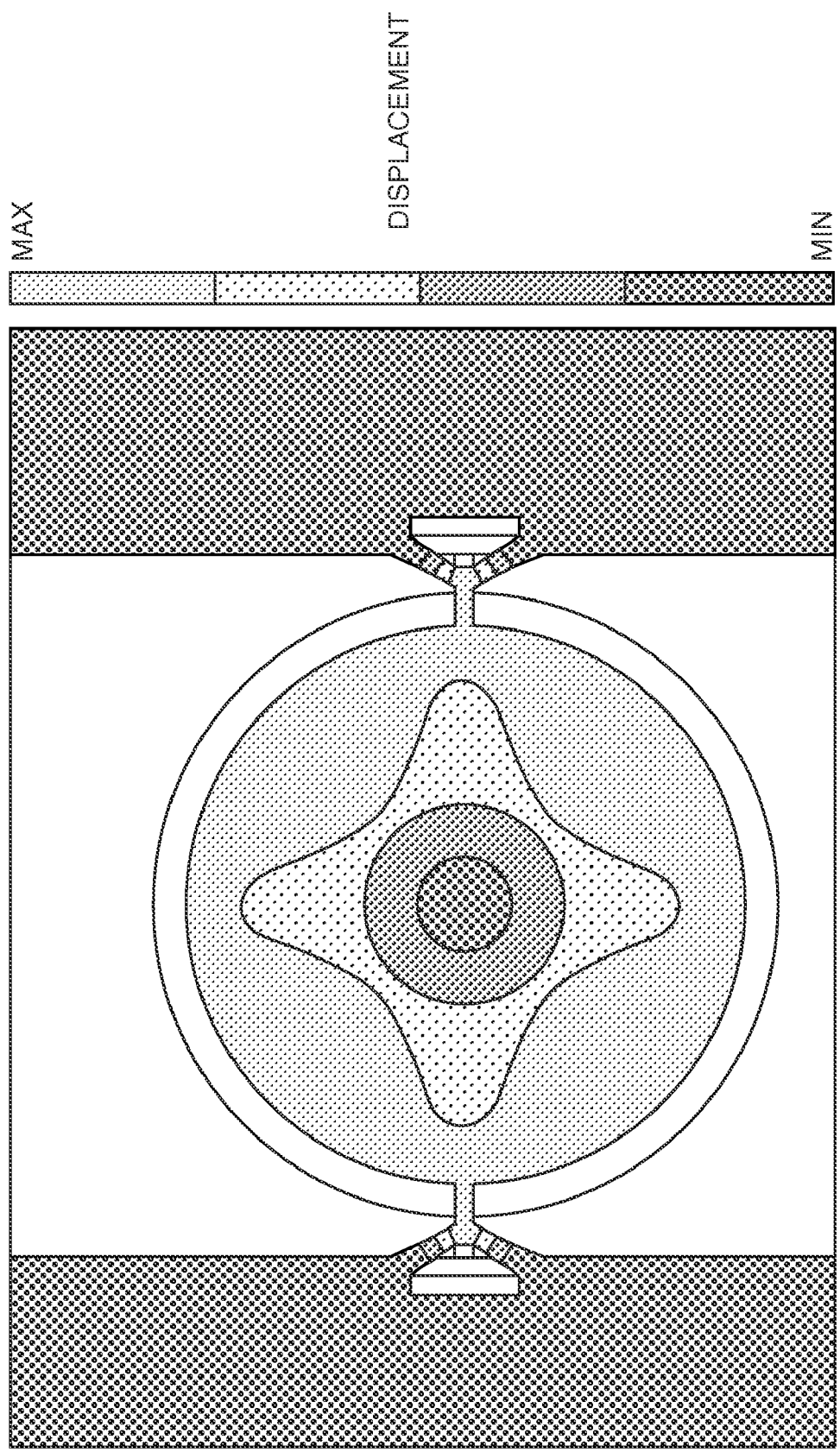
Figure 11:
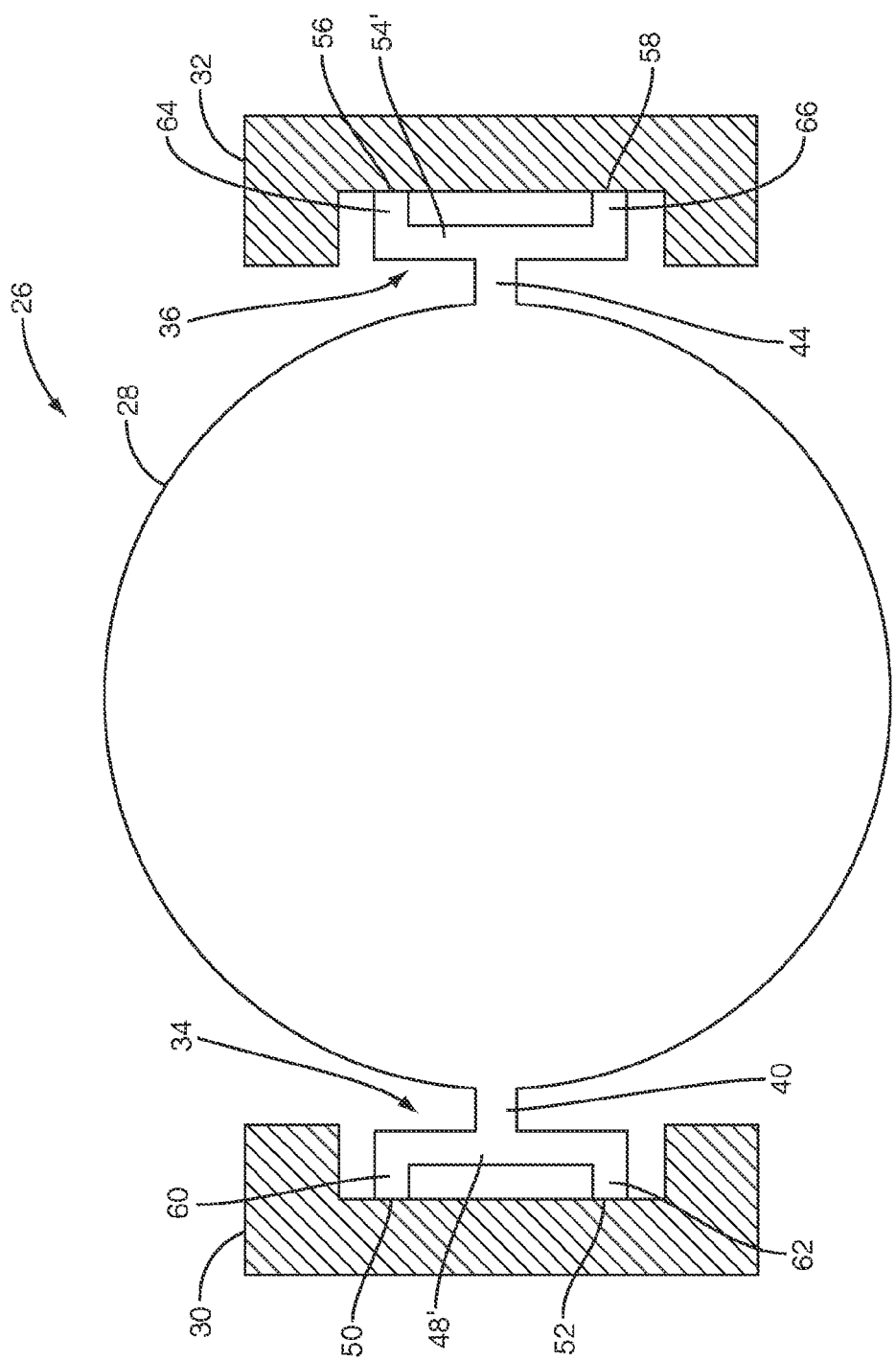
Figure 12:
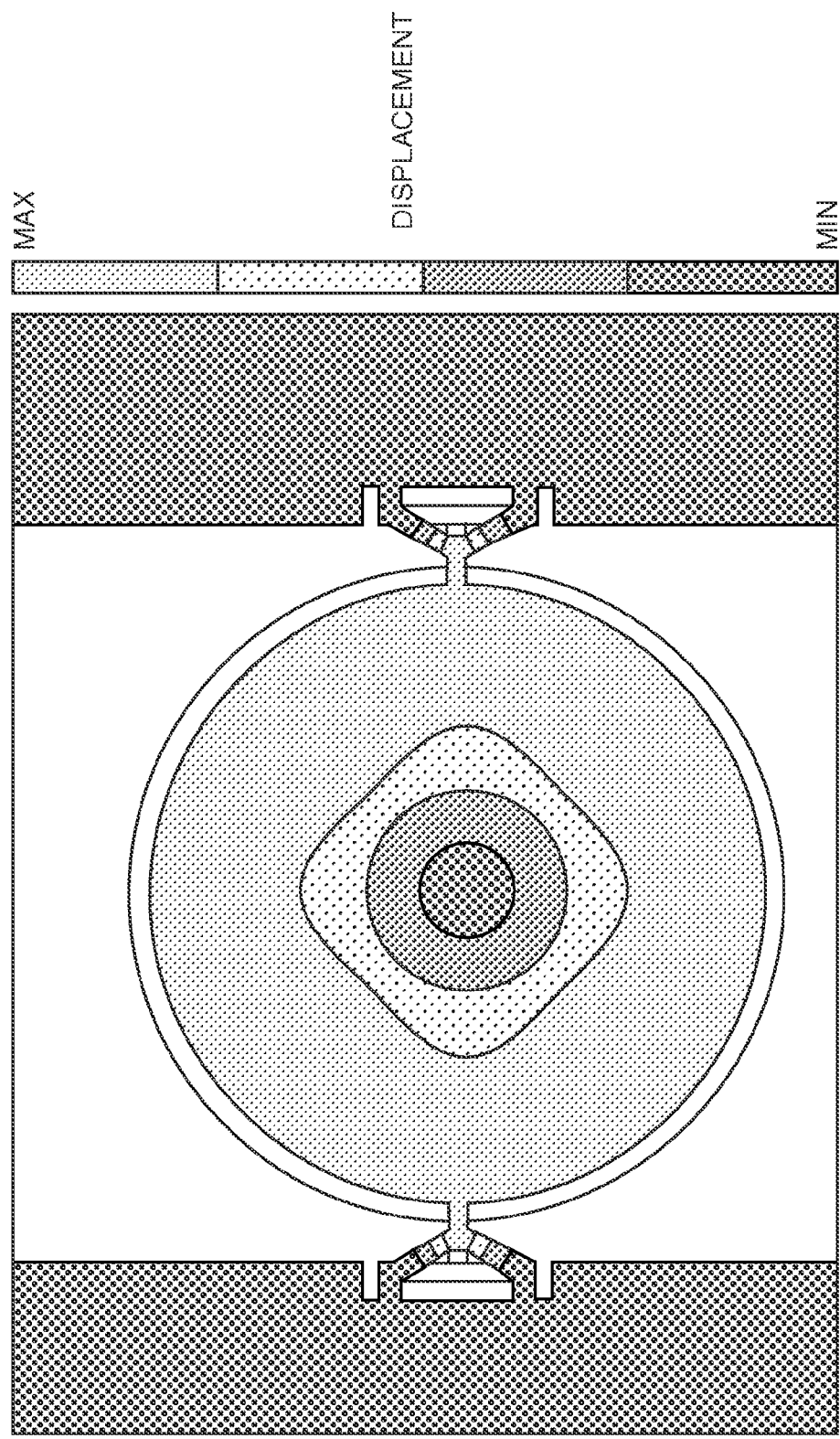
Figure 13:
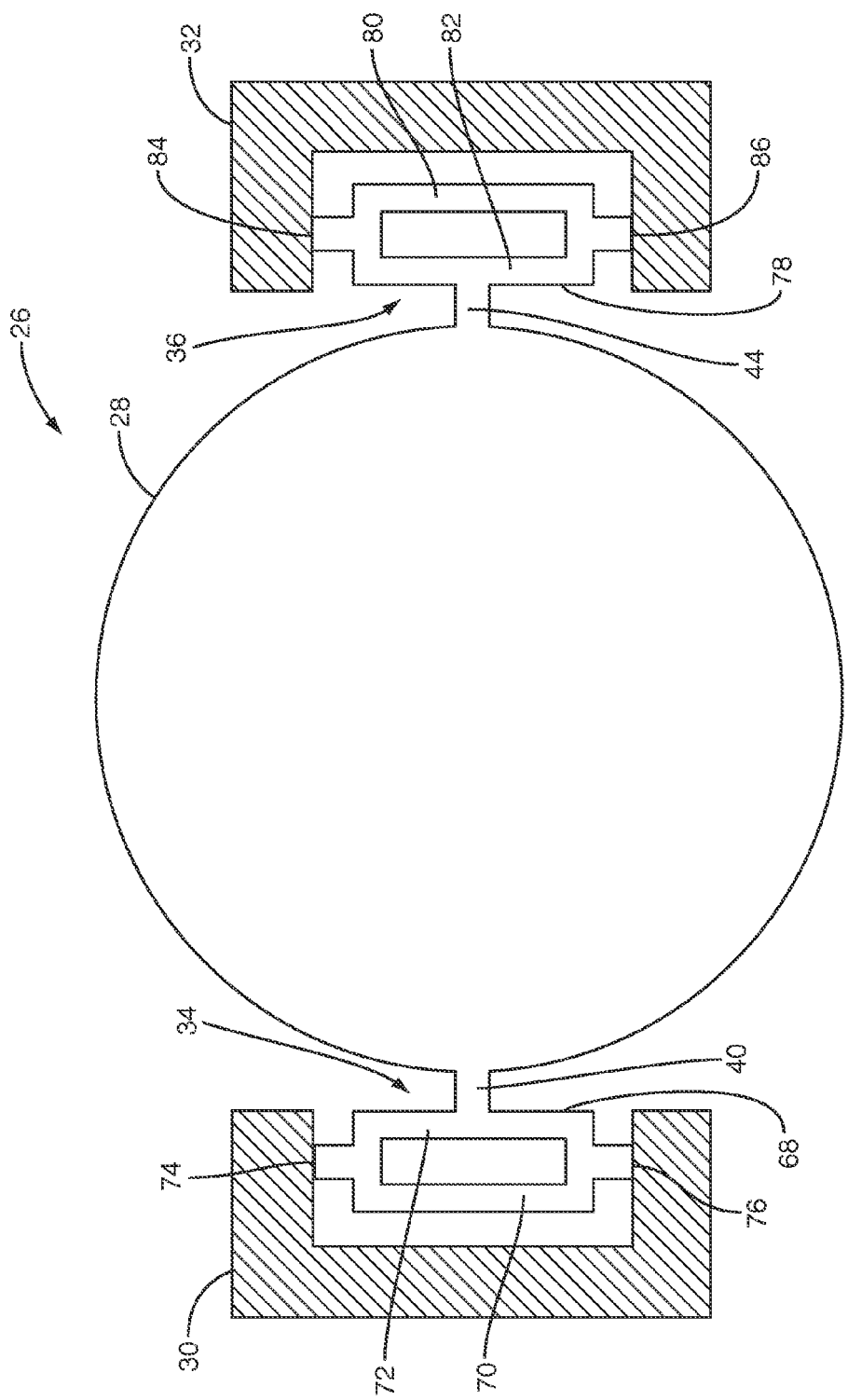
Figure 14:
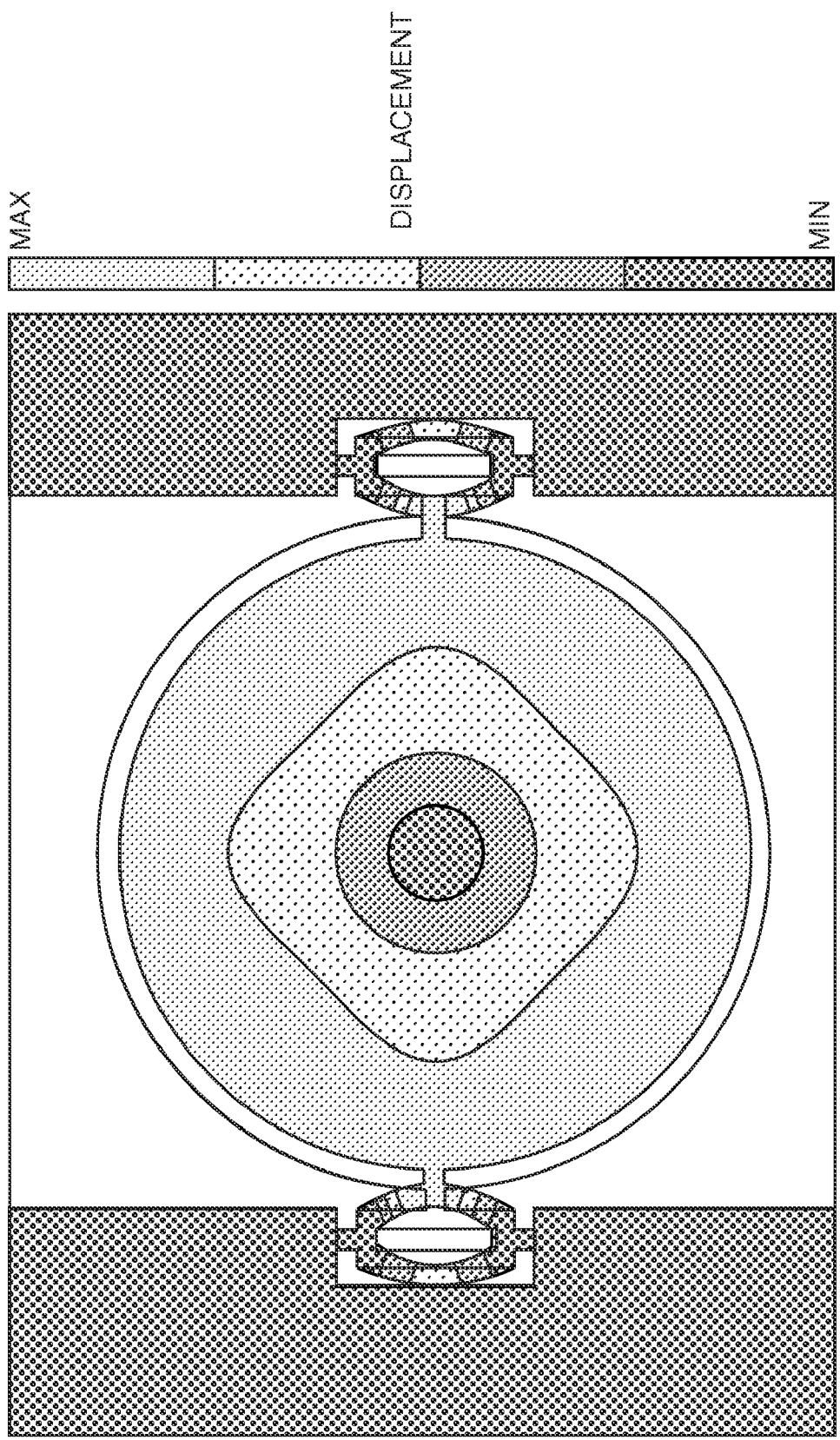
Figure 15:
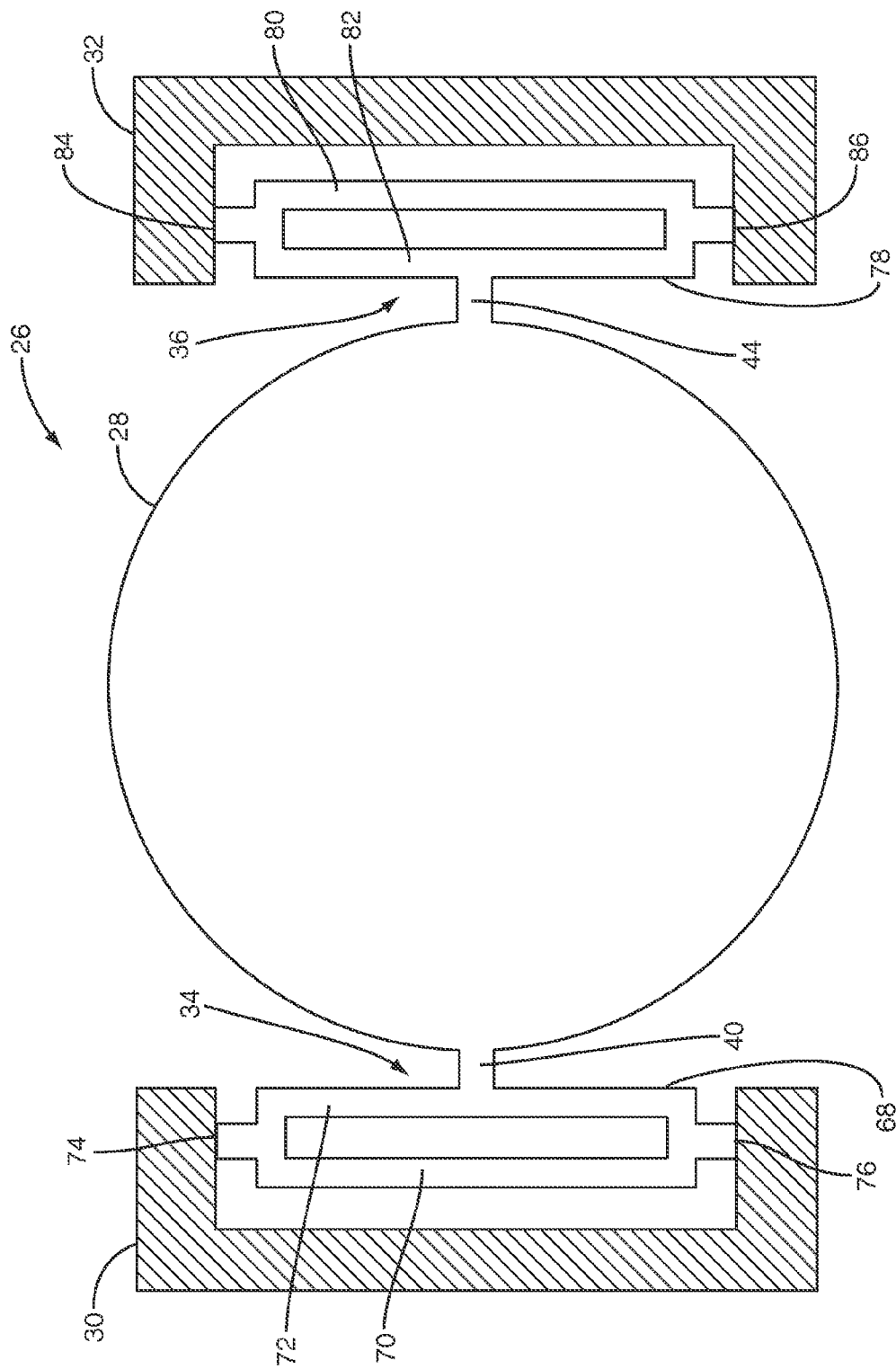
Figure 16:
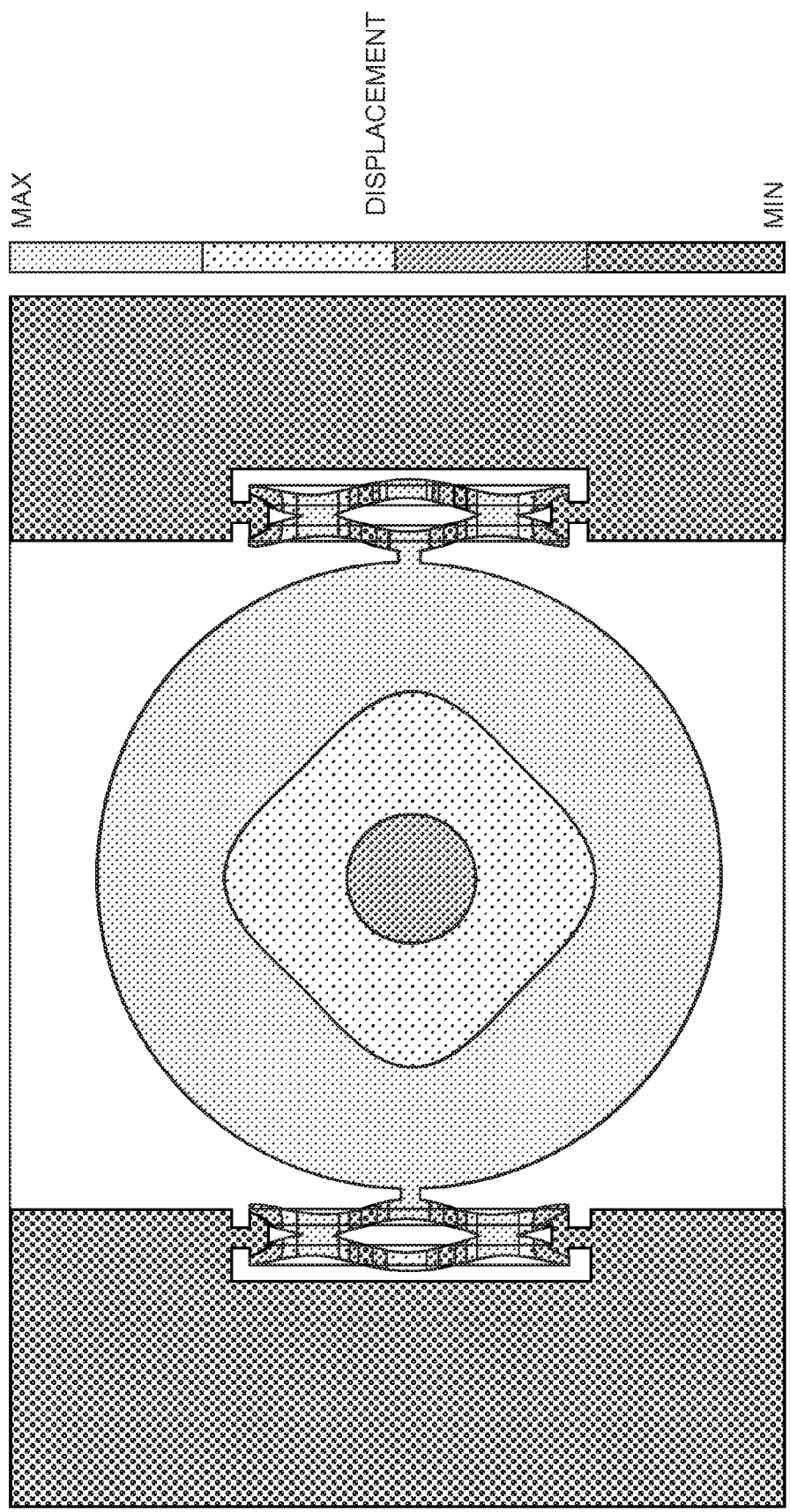

FIG. 9 provides a perspective view of the MEMS resonator of FIG. 8 according to one embodiment of the present invention;

FIG. 10 is a graphical illustration of a modal analysis of the MEMS resonator of FIG. 8;

FIG. 11 illustrates an exemplary MEMS resonator having modified clamped-clamped support structures including coupling beams of a length substantially shorter than quarter-wavelength (λ/4) according to a second embodiment of the present invention;

FIG. 12 is a graphical illustration of a modal analysis of the MEMS resonator of FIG. 11;

FIG. 13 illustrates an exemplary MEMS resonator having mechanically symmetric support structures and anchor points located at points on the mechanically symmetric support structures having minimal or essentially no vibration according to a third embodiment of the present invention;

FIG. 14 is a graphical illustration of a modal analysis of the MEMS resonator of FIG. 13;

FIG. 15 illustrates an exemplary MEMS resonator having mechanically symmetric support structures designed to provide multimode symmetric vibration and having anchor points located at points on the mechanically symmetric support structures having minimal or essentially no vibration according to a fourth embodiment of the present invention; and FIG. 16 is a graphical illustration of a modal analysis of the MEMS resonator of FIG. 15.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
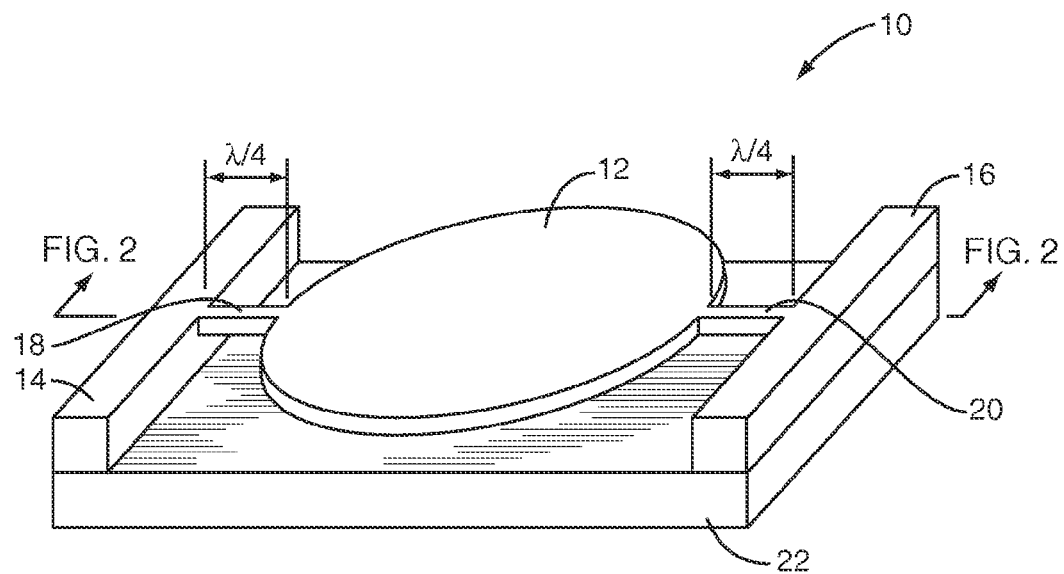
Figure 2:
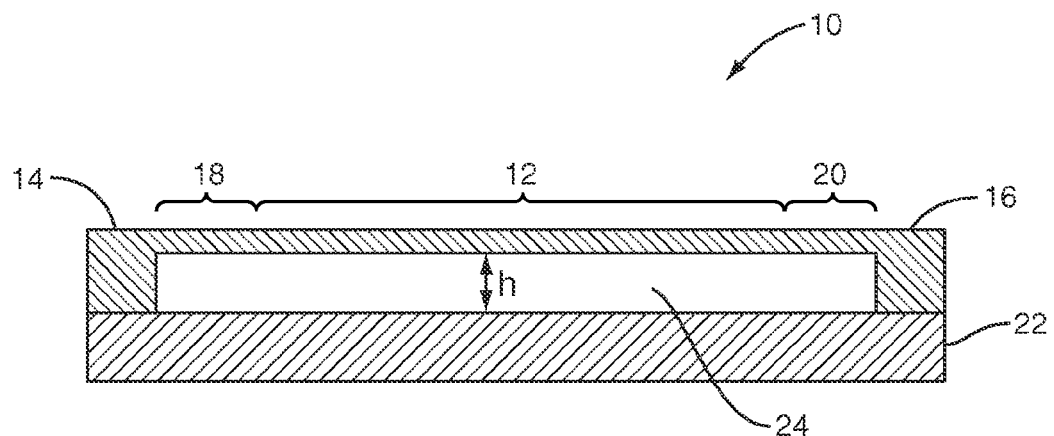
Figure 3:
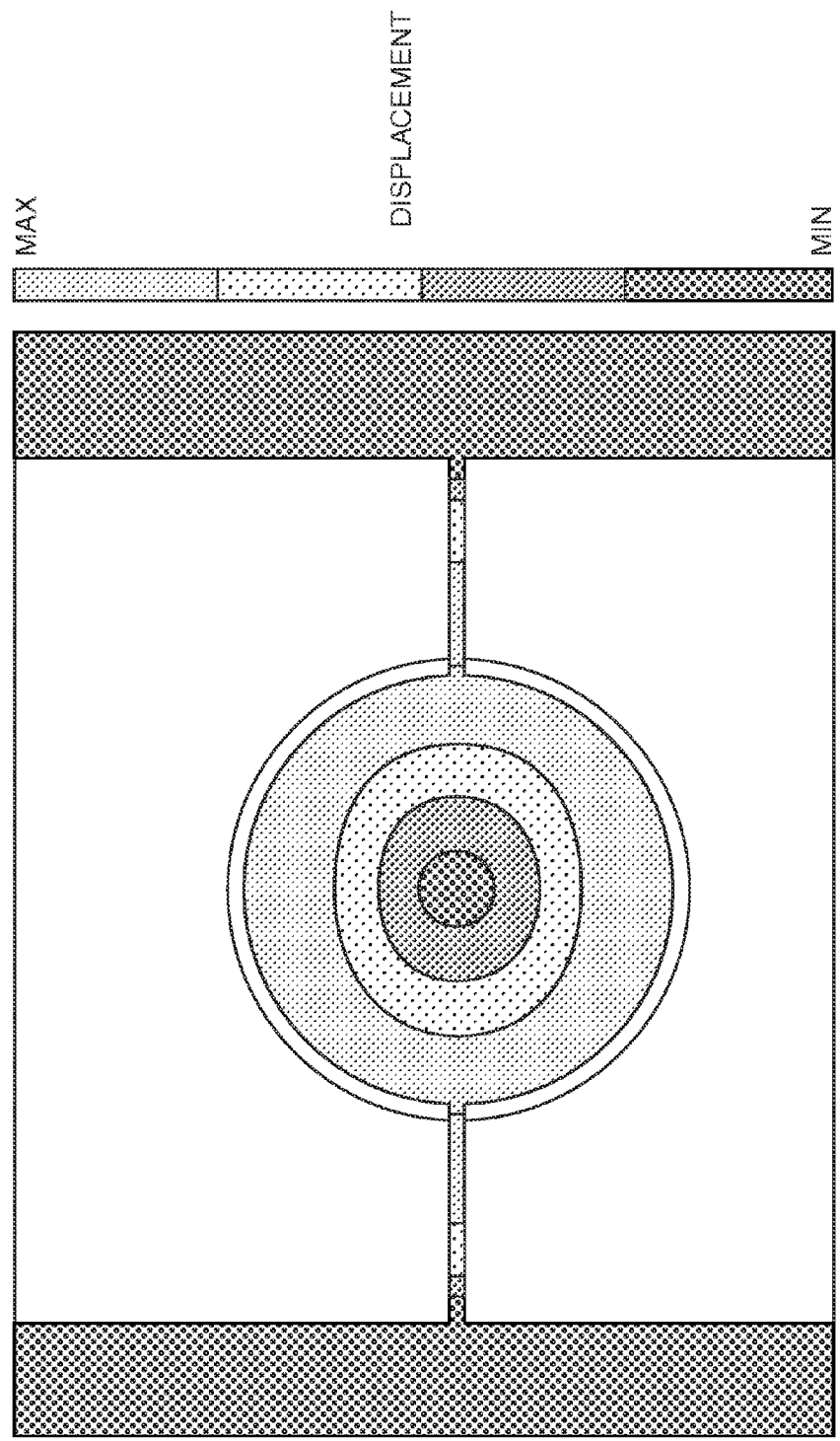
FIG. 3 is a graphical illustration of a modal analysis of the conventional MEMS resonator of FIGS. 1 and 2.
Figure 4:
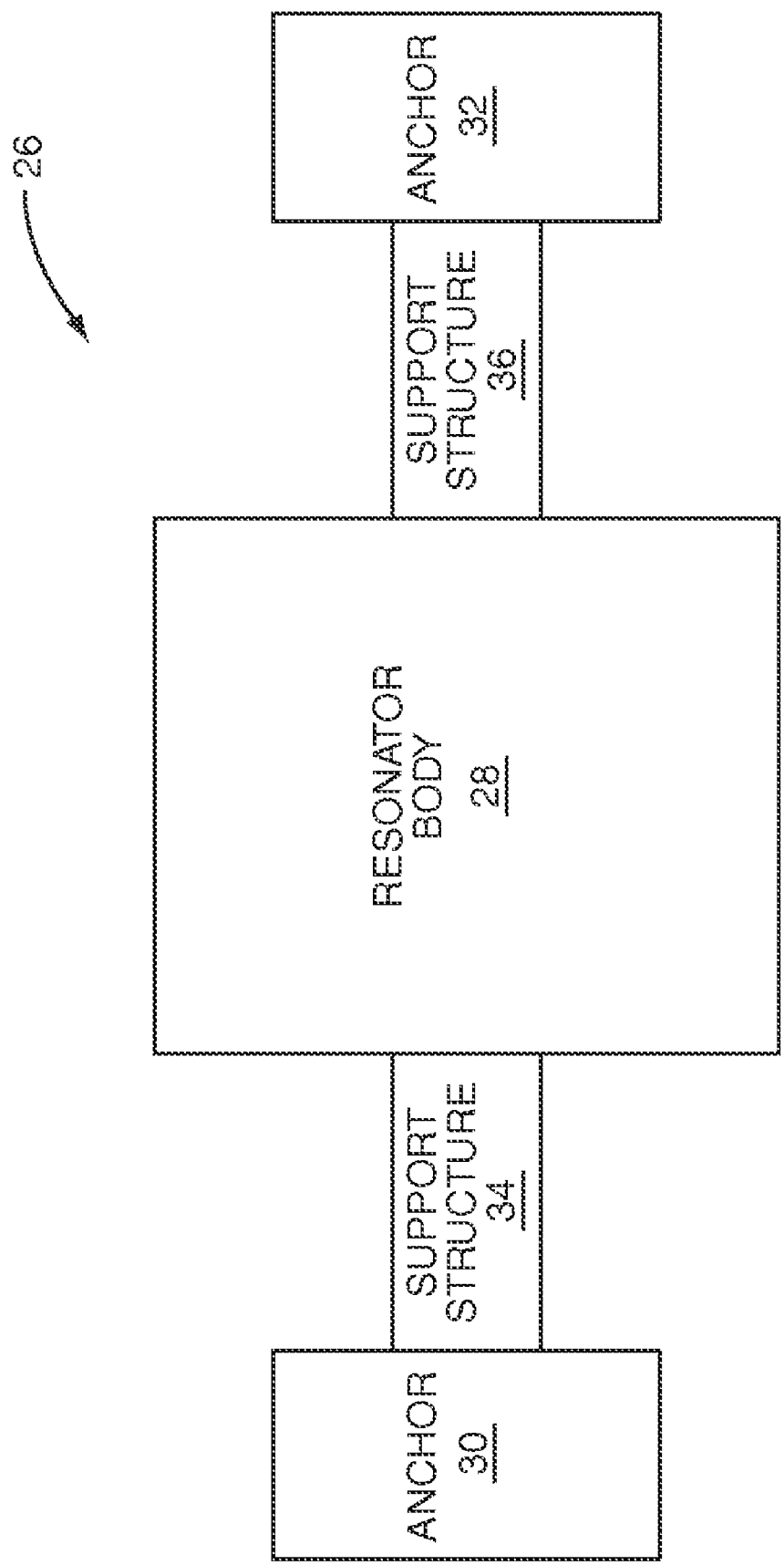
FIG. 4 is a block diagram of a MEMS resonator according to one embodiment of the present invention.

The present invention provides support, or anchor, structures for MEMS resonators that reduce or eliminate one or more of the anchor losses occurring in the conventional MEMS resonator 10 of FIGS. 1 and 2. Before discussing specific embodiments of the present invention, a mathematical understanding of a MEMS resonator may be beneficial. FIG. 4 is a block diagram of a MEMS resonator 26. The MEMS resonator 26 includes a resonator body 28 connected to anchors 30 and 32 by support structures 34 and 36, respectively. While not illustrated, like the anchors 14 and 16 of FIGS. 1 and 2, the anchors 30 and 32 are connected to or are part of a substrate. Note that the anchors 30 and 32 may be part of a single anchor structure surrounding the resonator body 28 or may be two separate anchor structures. The support structures 34 and 36 and the resonator body 28 are separated from the substrate by a gap of free space enabling vibration.

The MEMS resonator 26 can be modeled as a second order linear system expressed as:

$$x = \frac{\text{force}}{k_r\left(1 + j\left(\frac{\omega}{\omega_r \cdot Q_r}\right) - \left(\frac{\omega}{\omega_r}\right)^2\right)} \text{ and} \quad \text{(Eqn. 1)}$$

$$x = \frac{\text{force}}{k_s\left(1 + j\left(\frac{\omega}{\omega_s \cdot Q_s}\right) - \left(\frac{\omega}{\omega_s}\right)^2\right)},$$

where x represents the displacement of both the resonator body 28 and the support structures 34 and 36, $k_r$, $\omega_r$, and $Q_r$ are a spring stiffness, resonant frequency in radians, and quality factor for the resonator body 28, and $k_s$, $\omega_s$, and $Q_s$ are a spring stiffness, resonant frequency in radians, and quality factor for the support structures 34 and 36. The composite system can be modeled as a parallel connection of two spring systems and expressed as:

$$x = \frac{\text{force}}{k_r\left(1 + j\left(\frac{\omega}{\omega_r \cdot Q_r}\right) - \left(\frac{\omega}{\omega_r}\right)^2\right) + k_s\left(1 + j\left(\frac{\omega}{\omega_s \cdot Q_s}\right) - \left(\frac{\omega}{\omega_s}\right)^2\right)},$$

which may be further reduced to:

$$x = \frac{\text{force}}{k_o\left(1 + j\left(\frac{\omega}{\omega_o \cdot Q_o}\right) - \left(\frac{\omega}{\omega_o}\right)^2\right)}, \quad \text{(Eqn. 2)}$$

where $k_o$, $\omega_o$, and $Q_o$ are a composite spring stiffness, composite resonant frequency in radians, and composite quality factor for the MEMS resonator 26. The composite spring stiffness $k_o$ may be expressed as:

$$k_o = k_r + k_s, \quad \text{(Eqn. 3)}$$

the composite resonant frequency $\omega_o$ may be expressed as:

$$\frac{1}{\omega_o^2} = \frac{k_s}{k_o} \cdot \frac{1}{\omega_s^2} + \frac{k_r}{k_o} \cdot \frac{1}{\omega_r^2}, \text{ and} \quad \text{(Eqn. 4)}$$

the composite quality factor $Q_o$ may be expressed as:

$$\frac{k_o}{w_o \cdot Q_o} = \frac{k_r}{\omega_r \cdot Q_r} + \frac{k_s}{\omega_s \cdot Q_s} \rightarrow Q_o = \frac{1}{\left(\frac{\omega_o}{\omega_r} \cdot \frac{k_r}{k_o}\right) \cdot \frac{1}{Q_r} + \left(\frac{\omega_o}{\omega_s} \cdot \frac{k_s}{k_o}\right) \cdot \frac{1}{Q_s}}. \quad \text{(Eqn. 5)}$$

Figure 5:
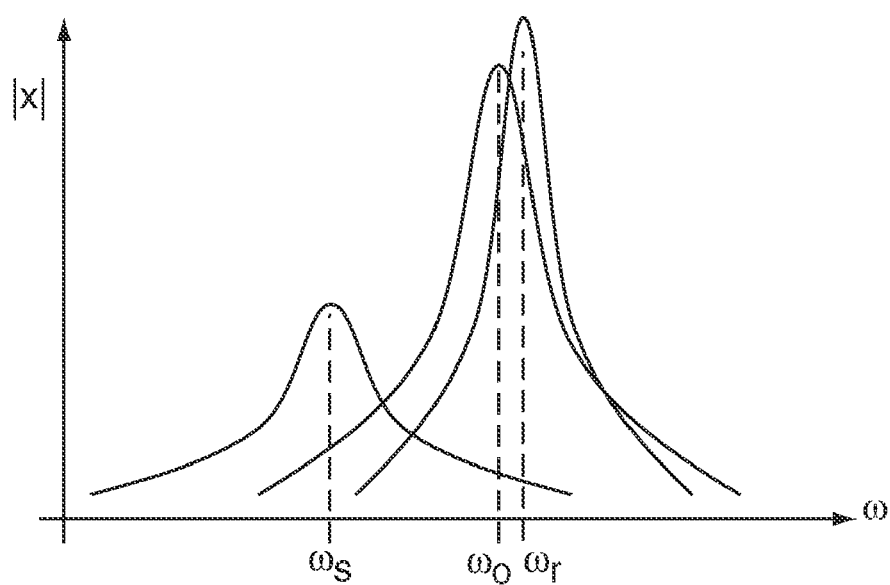
FIG. 5 illustrates the effects of a mismatch between a resonant frequency of a clamped-clamped supporting structure of the MEMS resonator and a resonant frequency of a resonator body of the MEMS resonator on a composite resonant frequency of the MEMS resonator.
Figure 6:
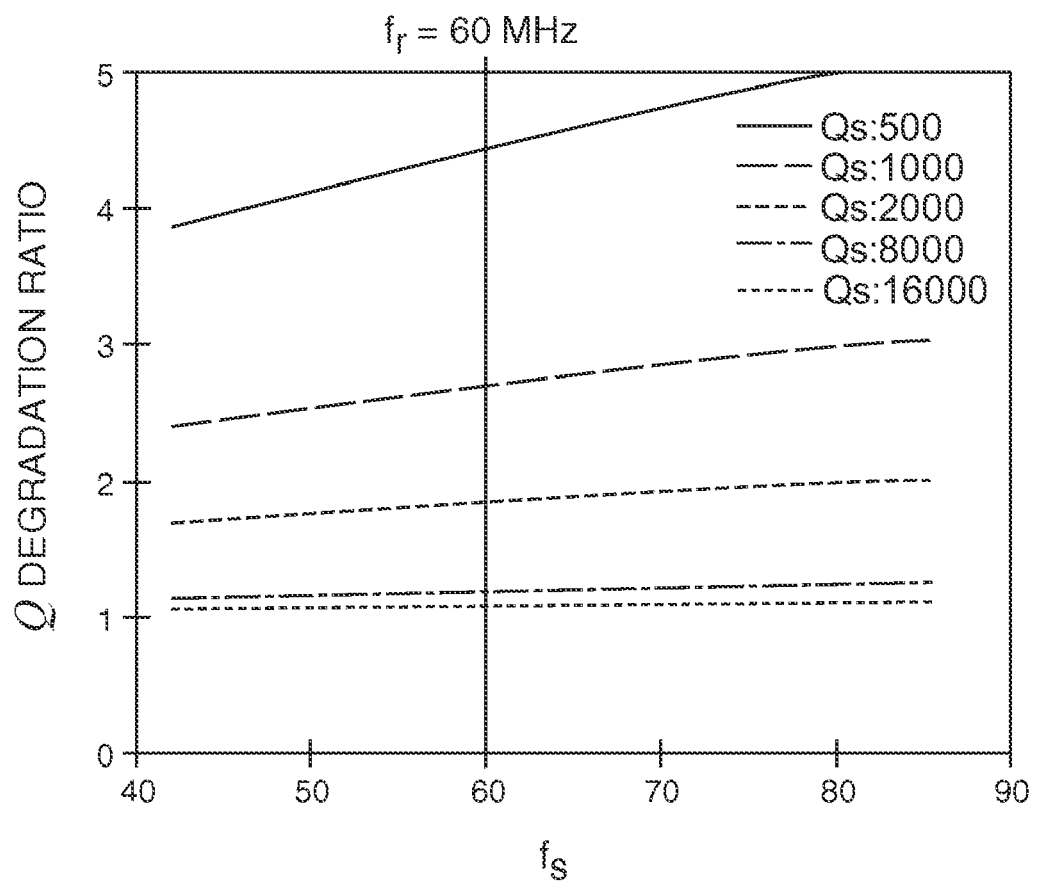
FIG. 6 is a graphical illustration of a quality factor (Q) degradation ratio with respect to the resonant frequency of the supporting structure.

From equations 1 through 5 it can be seen that the resonant frequency ($\omega_s$) of the support structures 34 and 36 does not need to match the resonant frequency ($\omega_r$) of the resonator body 28. This is further illustrated in FIG. 5. Additionally, as illustrated in FIG. 6, a quality factor (Q) degradation ratio, $Q_r/Q_o$, is not substantially affected if the resonant frequency ($f_s$), which in this figure is shown in MHz, of the support structures 34 and 36 does not match the resonant frequency ($f_r$) of the resonator body 28. This is especially true as the quality factor ($Q_s$) of the support structures 34 and 36 becomes large. Also note that equation 5 illustrates that the composite quality factor ($Q_o$) of the MEMS resonator 26 may be increased by increasing the quality factor ($Q_s$) of the support structures 34 and 36 and/or decreasing the spring stiffness ($k_s$) of the support structures 34 and 36.

Figure 7:
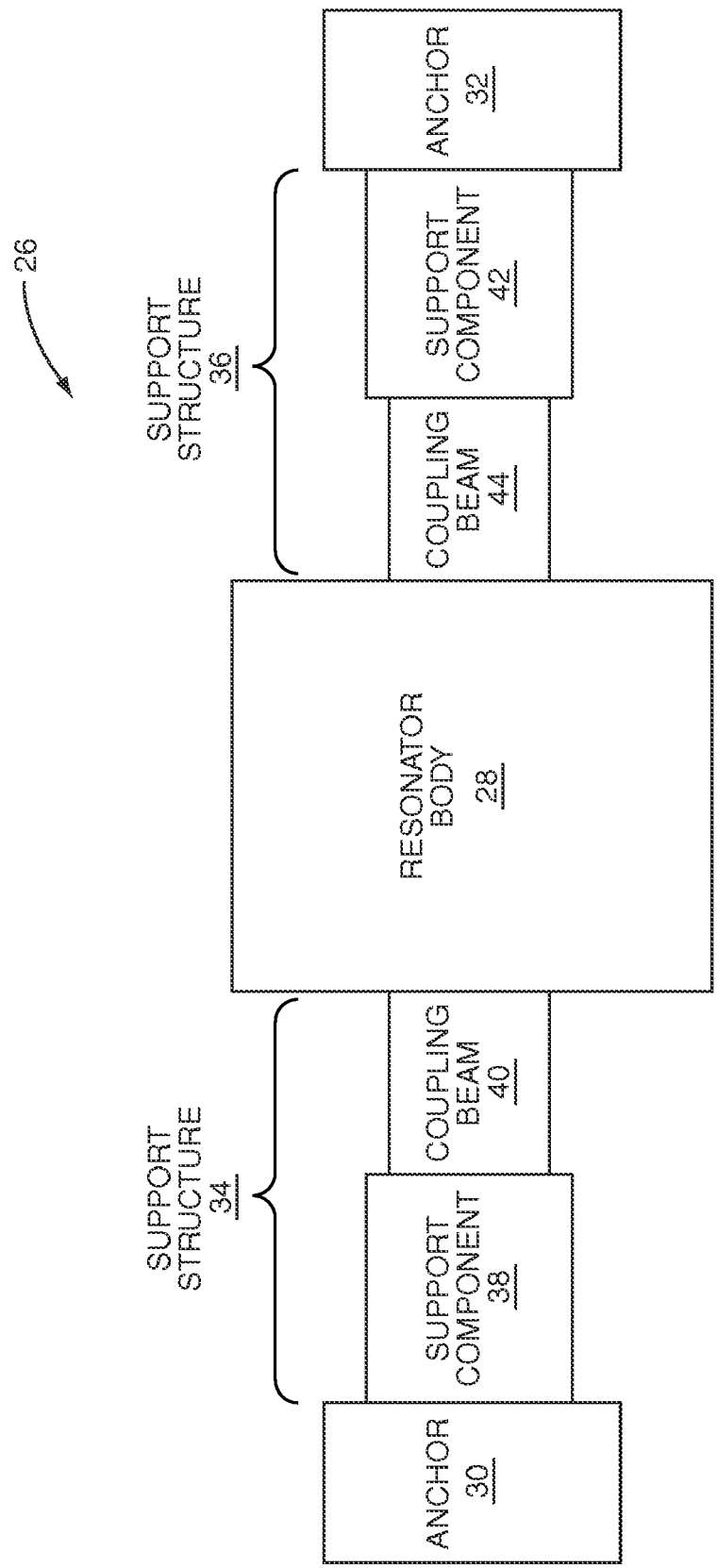
FIG. 7 is a block diagram of a MEMS resonator having support structures including coupling beams of a length substantially shorter than quarter-wavelength (λ/4) according to the present invention.

FIG. 7 is a block diagram of a MEMS resonator 26 according to the present invention. Again, the MEMS resonator 26 includes the resonator body 28 connected to the anchors 30 and 32 by the support structures 34 and 36, respectively. Note that while two support structures 34 and 36 are illustrated, the MEMS resonator 26 may include any number of one or more support structures depending on the implementation. As illustrated, the support structure 34 more specifically includes a support component 38 and a coupling beam 40. Likewise, the support structure 36 includes a support component 42 and a coupling beam 44. The coupling beams 40 and 44 interconnect the support components 38 and 42, respectively, to the resonator body 28. Since the resonant frequency of the support structures 34 and 36 does not need to match that of the resonator body 28, the coupling beams 40 and 44 are other than quarter-wavelength ($\lambda/4$) if desired. In one embodiment, the coupling beams 40 and 44 have the minimum lengths possible with the fabrication process utilized to fabricate the MEMS resonator 26.

Preferably, the coupling beams 40 and 44 are as short as allowed by the manufacturing techniques used to fabricate the MEMS resonator 26. For example, in one embodiment, a fabrication process may be used that enables the coupling beams 40 and 44 to have lengths of 1 or 2 microns whereas corresponding quarter-wavelength ($\lambda/4$) support beams would have lengths of approximately 20 microns. In another embodiment, the coupling beams 40 and 44 may have lengths substantially less than quarter-wavelength ($\lambda/4$). As an example, the coupling beams 40 and 44 may have lengths less than a fraction of the quarter-wavelength ($\lambda/4$) such as, for example, $3/4$, $1/2$, or $1/4$ of the quarter-wavelength ($\lambda/4$) of the resonant frequency of the resonator body 28 and/or the resonant frequency of the MEMS resonator 26. Note that for higher frequencies, such as for example 1-2 gigahertz (GHz), the fabrication process may not enable the coupling beams 40 and 44 to have lengths less than or equal to quarter-wavelength ($\lambda/4$). While this may be an issue with the conventional MEMS resonator 10 of FIG. 1, the support structures 34 and 36 of the MEMS resonator 26 of the present invention may have resonant frequencies that are different than that of the resonator body 28 without substantially affecting the composite quality factor ($Q_o$). As such, the coupling beams 40 and 44 may also have lengths greater than quarter-wavelength ($\lambda/4$) if desired.

In one embodiment, $\omega_r \approx \omega_s \approx \omega_o$, $k_s \ll k_r$ such that $k_o \approx k_r$, and composite quality factor ($Q_o$) of at least $Q_r/2$ is desired. Thus, starting with equation 5 from above:

$$\frac{k_o}{\omega_o \cdot Q_o} = \frac{k_r}{\omega_r \cdot Q_r} + \frac{k_s}{\omega_s \cdot Q_s} \rightarrow Q_o = \frac{1}{\left(\frac{\omega_o}{\omega_r} \cdot \frac{k_r}{k_o}\right) \cdot \frac{1}{Q_r} + \left(\frac{\omega_o}{\omega_s} \cdot \frac{k_s}{k_o}\right) \cdot \frac{1}{Q_s}}.$$

Since $\omega_r \approx \omega_o$, $k_o \approx K_r$, $\omega_s \approx \omega_o$, Equation (5) yields:

$$Q_o \approx \frac{1}{\frac{1}{Q_r} + \frac{k_{so}}{Q_s}} \xrightarrow{Q_o \geq \frac{Q_r}{2}} \frac{1}{Q_r} \geq \frac{k_{so}}{Q_s} \rightarrow k_{so} \approx \frac{k_s}{k_r} \leq \frac{Q_s}{Q_r}, \quad \text{(Eqn. 6)}$$

where:

$$k_{so} = \frac{k_s}{k_o}. \quad \text{(Eqn. 7)}$$

Thus, the composite quality factor ($Q_o$) of the MEMS resonator 26 is controlled by $k_{so}$ and $Q_s$. The parameters $k_{so}$ and $Q_s$ mitigate the requirement of each other, i.e., a higher $Q_s$ allows a higher $k_s$ and a lower $k_s$ allows a lower $Q_s$. Therefore, high $Q_s$ and low $k_s$ are desirable for the design of support structures in order to maximize the composite quality factor ($Q_o$). In one exemplary embodiment, in the MEMS resonator 26, the quality factor ($Q_s$) of the support structures 34 and 36 is in the approximate range of $1/10$ to $1/1000$ of the quality factor ($Q_r$) of the resonator body 28, and the spring stiffness ($k_s$) of the support structures 34 and 36 is in the approximate range of 1/10 to 1/1000 of the spring stiffness ($k_r$) of the resonator body 28. As a result, the composite quality factor ($Q_o$) of the MEMS resonator 26 is substantially improved as compared to that of the conventional MEMS resonator 10 (FIG. 1). Note that the ranges for $Q_s$ and $k_s$ given above are exemplary and are not intended to limit the scope the present invention. The ranges may vary depending on the particular implementation, as will be appreciated by one of ordinary skill in the art.

FIGS. 8 and 9 provide a more detailed illustration of the MEMS resonator 26 according to a first exemplary embodiment of the present invention. Again, the MEMS resonator 26 includes the resonator body 28 connected to the anchors 30 and 32 by the support structures 34 and 36, respectively. In this example, the resonator body 28 is disc-shaped. However, the present invention is not limited thereto. The resonator body 28, anchors 30 and 32, and support structures 34 and 36 are preferably made of acoustic materials such as, for example, silicon or piezo crystals such as quartz, lithium tantalate, lithium niobate, aluminum nitride, zinc oxide, or the like. As shown in FIG. 9, the anchors 30 and 32 are connected to or part of a substrate 46, and the support structures 34 and 36 and the resonator body 28 are separated from the substrate 46 by a gap of free space having a height (h) in order to enable vibration. The resonator body 28 may be any type of vibrating MEMS resonator such as, for example, a piezo-transduced MEMS resonator, an electrostatically transduced MEMS resonator, a Thin Film Bulk Acoustic Resonator (FBAR), a piezoelectric resonator, or the like.

In this embodiment, the support structures 34 and 36 are clamped-clamped support structures. More specifically, in this embodiment, the support component 38 (FIG. 7) of the support structure 34 is formed by a clamped-clamped beam 48, which is connected to the resonator body 28 by the coupling beam 40. The clamped-clamped beam 48 has a first end connected to the anchor 30 at an anchor point 50 and a second end connected to the anchor 30 at an anchor point 52. The coupling beam 40 has a first end connected to the clamped-clamped beam 48 at an intermediate point of the clamped-clamped beam 48 between the first and second ends of the clamped-clamped beam 48. A second end of the coupling beam 40 is connected to the resonator body 28. Likewise, the support component 42 (FIG. 7) of the support structure 36 is formed by a clamped-clamped beam 54, which is connected to the resonator body 28 by the coupling beam 44. The clamped-clamped beam 54 has a first end connected to the anchor 32 at an anchor point 56 and a second end connected to the anchor 32 at an anchor point 58. The coupling beam 44 has a first end connected to the clamped-clamped beam 54 at an intermediate point of the clamped-clamped beam 54 between the first and second ends of the clamped-clamped beam 54. A second end of the coupling beam 44 is connected to the resonator body 28. Note that while the discussion herein uses the phrase "connected to" with respect to the anchors 30 and 32, the support structures 34 and 36, and the resonator body 28, one of ordinary skill in the art will recognize that the anchors 30 and 32, the support structures 34 and 36, and the resonator body 28 may completely or partially be formed from a common epitaxial material by, for example, etching.

The clamped-clamped beam support structures 34 and 36 of FIG. 8 are designed such that the spring stiffness ($k_s$) of the support structures 34 and 36 is substantially less than that of the quarter-wavelength ($\lambda/4$) support beams 18 and 20. Thus, according to equation 5 above, by reducing the spring stiffness ($k_s$) of the support structures 34 and 36, the composite quality factor ($Q_o$) is increased.

However, the composite quality factor ($Q_o$) of the MEMS resonator 26 of FIGS. 8 and 9 is limited or reduced by the fact that the support components 38 and 42, which are the clamped-clamped beams 48 and 54, of the support structures 34 and 36 of this embodiment are not mechanically symmetric. As used herein, a mechanically symmetric support component is a support component that vibrates as if it experiences no, or essentially no, forced boundary condition. As discussed below, the composite quality factor ($Q_o$) can be substantially improved by using a mechanically symmetric support structure and anchoring the mechanically symmetric support structure at nodal points that naturally experience essentially no vibration when the MEMS resonator 26 is in vibration mode. Thus, the clamped-clamped beams 48 and 54 are not mechanically, or vibrationally, symmetric because the clamped-clamped beams 48 and 54 are forced to be anchored at both ends, where the ends of the clamped-clamped beams 48 and 54 would not be nodal points if the clamped-clamped beams 48 and 54 were in vibration without any forced boundary condition. This is illustrated in FIG. 10, which provides a modal analysis of the MEMS resonator 26 of FIGS. 8 and 9. As shown in FIG. 10, the anchor points 50, 52, 56, and 58 are at points on the clamped-clamped beams 48 and 54 having significant vibrational energy. As such, a significant amount of stress is induced in order to keep the anchor points 50, 52, 56, and 58 fixed, thereby resulting in a significant amount of energy loss through the anchors 30 and 32 into the substrate 46.

FIG. 11 is a more detailed illustration of the MEMS resonator 26 according to a second exemplary embodiment of the present invention. This embodiment is similar to the embodiment of FIGS. 8 and 9. However, the support structures 34 and 36 in this embodiment are modified clamped-clamped support structures that further reduce the spring stiffness ($k_s$) and approach vibration mode close to mechanical symmetry.

In this embodiment, the support structures 34 and 36 are modified clamped-clamped support structures. More specifically, the support component 38 (FIG. 7) of the support structure 34 is formed by a modified clamped-clamped beam 48', which is connected to the resonator body 28 by the coupling beam 40. As illustrated, the modified clamped-clamped beam 48' includes detours 60 and 62, which in turn modify the anchor points 50 and 52 at which the support structure 34 is attached to the anchor 30. Likewise, the support component 42 (FIG. 7) of the support structure 36 is formed by a modified clamped-clamped beam 54', which is connected to the resonator body 28 by the coupling beam 44. As illustrated, the modified clamped-clamped beam 54' includes detours 64 and 66, which in turn modify the anchor points 56 and 58 at which the support structure 36 is attached to the anchor 32.

By detouring the anchor points 50, 52, 56, and 58, the spring stiffness ($k_s$) of the modified clamped-clamped support structures 34 and 36 is reduced as compared to that of the clamped-clamped support structures 34 and 36 of FIGS. 8 and 9. In addition, as illustrated in FIG. 12, by detouring the anchor points 50, 52, 56, and 58, the modified clamped-clamped support structures 34 and 36 approach mechanical symmetry. As a result, the quality factor ($Q_s$) is substantially improved. Since the spring stiffness ($k_s$) is reduced and since the modified clamped-clamped support structures 34 and 36 have a vibration mode that is close to mechanical symmetry, the composite quality factor ($Q_o$) is substantially increased as compared to that of the conventional MEMS resonator 10 of FIGS. 1 and 2 and the MEMS resonator 26 having the clamped-clamped support structures 34 and 36 of FIG. 8. For example, in one embodiment, the clamped-clamped support structures 34 and 36 of FIG. 8 may be formed of single crystal silicon, have dimensions of 1×6×2 micrometers (μm), have a spring stiffness ($k_s$) of approximately 8,300 Newtons per meter (N/m), and have a quality factor ($Q_s$) of 132. In contrast, a similar embodiment of the clamped-clamped support structures 34 and 36 of FIG. 11 provide a spring stiffness ($k_s$) of approximately 7,700 N/m and, more importantly, a quality factor ($Q_s$) of 646.

FIG. 13 illustrates the MEMS resonator 26 according to a third exemplary embodiment of the present invention. In this embodiment, the support structures 34 and 36 are mechanically symmetric support structures providing fundamental mode symmetric vibration when the resonator body 28 is vibrating or in vibration mode. More specifically, the support component 38 (FIG. 7) of the support structure 34 is formed by a mechanically symmetric support component 68, which is connected to the resonator body 28 by the coupling beam 40. In this exemplary embodiment, the mechanically symmetric support component 68 is a rectangular ring structure, which may also be referred to herein as a double-ended tuning fork structure, formed by beams 70 and 72 arranged as shown. Note that, in this embodiment, the length of each of the beams 70 and 72 may be selected to provide fundamental mode vibration when the MEMS resonator 26 is in vibration mode. Note that the resonant frequency of the support structure 34 does not need to match resonant frequency of resonator body 28.

The mechanically symmetric support component 68 vibrates as if it experiences no, or essentially no, forced boundary condition and is anchored at anchoring points 74 and 76 that are nodal points experiencing essentially no vibration. In other words, the mechanically symmetric support component 68 provides symmetric vibration about mirroring points having minimal or essentially no vibration when the MEMS resonator 26 is in vibration mode. The mirroring points are selected as the anchoring points 74 and 76. When vibrating, the vibration mode on the beam 70 is the same as the vibration mode on the beam 72 with out-of-phase providing momentum cancellation, resulting in mirroring points at which there is minimal or essentially no vibration. The mirroring points are also referred to herein as nodal points having minimal or essentially no vibration. By selecting the mirroring points as the anchoring points 74 and 76, dissipation of energy through the anchor 30 into the substrate 46 is reduced or minimized.

Likewise, the support component 42 (FIG. 7) of the support structure 36 is formed by a mechanically symmetric support component 78, which is connected to the resonator body 28 by the coupling beam 44. In this exemplary embodiment, the mechanically symmetric support component 78 is a rectangular ring structure, which may also be referred to herein as a double-ended tuning fork structure, formed by beams 80 and 82 arranged as shown. Again, the mechanically symmetric support component 78 provides symmetric vibration about mirroring points when in vibration mode. The mirroring points are selected as anchoring points 84 and 86. In other words, when vibrating, the vibration mode on the beam 80 is the same as the vibration mode on the beam 82, resulting in mirroring points at which there is minimal or essentially no vibration. The mirroring points are also referred to herein as nodal points having minimal or essentially no vibration. By selecting the mirroring points as the anchoring points 84 and 86, dissipation of energy through the anchor 32 into the substrate 38 is reduced or minimized.

The mechanically symmetric support components 68 and 78 provide cancellation of momentum at the anchoring points 74, 76 and 84, 86, respectively, causing essentially no vibration of the anchors 30 and 32. As a result, vibration is confined to the resonator body 28 and the support structures 34 and 36. As a result of using the mechanically symmetric support components 68 and 78 and anchoring the mechanically symmetric support components 68 and 78 at their respective mirroring points, energy losses through the anchors 30 and 32 into the substrate 46 are substantially reduced and, therefore, the composite quality factor ($Q_o$) of the MEMS resonator 26 is substantially increased. As an example, by using the mechanically symmetric support components 68 and 78 and by having the short coupling beams 40 and 44, the composite quality factor ($Q_o$) of the MEMS resonator 26 may be, for example, at least approximately 10 times that of the conventional MEMS resonator 10 of FIGS. 1 and 2. Note, however, that these improvement factors are exemplary and may vary from device to device depending on various factors, as will be apparent to one of ordinary skill in the art upon reading this disclosure.

FIG. 14 illustrates a modal analysis of the MEMS resonator 26 of FIG. 13. As can be seen, the vibration modes of the beams 70 and 72 of the mechanically symmetric support component 68 are symmetric. Likewise, the vibration modes of the beams 80 and 82 of the mechanically symmetric support component 78 are symmetric. Further, there are naturally occurring nodes having minimal or essentially no vibration at the locations of the anchor points 74, 76, 84, and 86.

FIG. 15 illustrates the MEMS resonator 26 according to a fourth exemplary embodiment of the present invention. This embodiment is substantially the same as that of FIG. 13. However, the length of the beams 70, 72, 80, and 82 are selected to achieve multimode symmetric vibration rather than fundamental mode vibration. More specifically, as the desired resonant frequency ($\omega_s$) for the support structures 34 and 36 increases, the length of the beams 70, 72, 80, and 82 of the mechanically symmetric support structures 68 and 78 would have to decrease in order to maintain fundamental mode operation. However, as the length of the beams 70, 72, 80, and 82 is decreased to accommodate higher resonance frequencies, the spring stiffness ($k_s$) increases and the quality factor ($Q_s$) decreases. Further, at some point, fabrication limitations may prevent further shortening of the beams 70, 72, 80, and 82. Thus, in this embodiment, the lengths of the beams 70, 72, 80, and 82 are selected to provide multimode symmetric vibration, thereby increasing the lengths of the beams 70, 72, 80, and 82 as compared to those used for fundamental mode symmetric vibration. As an example, by using the mechanically symmetric support components 68 and 78 with multimode symmetric vibration and by having the short coupling beams 40 and 44, the composite quality factor ($Q_o$) of the MEMS resonator 26 may be, for example, at least approximately 10 times that of the conventional MEMS resonator 10 of FIGS. 1 and 2. With careful design, the composite quality factor ($Q_o$) may exceed 100,000. Note, however, that the improvement factors given above are exemplary and may vary from device to device depending on various factors, as will be apparent to one of ordinary skill in the art upon reading this disclosure.

FIG. 16 illustrates a modal analysis of the MEMS resonator 26 of FIG. 15. As shown, there is multimode symmetric vibration of the beams 70, 72, 80, and 82. More specifically, each of the beams 70, 72, 80, and 82 has multiple points of high vibration and multiple points of low or essentially zero vibration. Further note that the anchor points 74, 76, 84, and 86 remain at mirroring points, which are nodes having minimal or essentially no vibration.

It should be noted that while the mechanically symmetric support components 68 and 78 of FIGS. 13-16 are illustrated as being rectangular rings or double-ended tuning fork shaped, the present invention is not limited thereto. For example, the mechanically symmetric support components 68 and 78 may be rectangular rings, square rings, circular rings, oval rings, hexagons, octagons, or similar structures that are mechanically symmetric and have nodal points where there is minimal or essentially no vibration that can be used for anchoring points. Still further, the mechanically symmetric support components 68 and 78 may be arrays of two or more rectangular rings, square rings, circular rings, oval rings, hexagons, octagons, similar structures, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. A Micro-Electro-Mechanical Systems (MEMS) resonator comprising:
    a first anchor coupled to a substrate on which the MEMS resonator is formed, the first anchor having a first anchor point and a second anchor point;
    a resonator body;
    a first mechanically symmetric support structure including:
        a first beam having a first end and a second end;
        a second beam having a first end and a second end, and wherein the second beam is substantially parallel to the first beam;
        a first connecting beam extending between the first end of the first beam and the first end of the second beam;
        a second connecting beam extending between the second end of the first beam and the second end of the second beam;
        a first anchor beam extending between the first connecting beam and the first anchor point; and
        a second anchor beam extending between the second connecting beam and the second anchor point; and
    a first coupling beam extending between the first mechanically symmetric support structure and the resonator body.

2. The MEMS resonator of claim 1 wherein the first mechanically symmetric support structure is configured to vibrate as if the first mechanically symmetric support structure experiences essentially no forced boundary condition when the MEMS resonator is in vibration mode.

3. The MEMS resonator of claim 1 wherein the first anchor point and the second anchor point of the first anchor are nodes at which there is naturally essentially no vibration when the MEMS resonator is vibrating.

4. The MEMS resonator of claim 3, wherein the first mechanically symmetric support structure is configured to substantially vibrate symmetrically with respect to the first anchor point and the second anchor point when the MEMS resonator is vibrating.

5. The MEMS resonator of claim 1 wherein the first mechanically symmetric support structure is configured to provide, when the resonator body is vibrating, a fundamental mode symmetric vibration.

6. The MEMS resonator of claim 1 wherein the lengths of the first beam and the second beam are configured to provide substantially multimode symmetric vibration of the first mechanically symmetric support structure.

7. The MEMS resonator of claim 1 wherein a length of the first coupling beam is substantially less than a quarter-wavelength value for a resonant frequency of the resonator body.

8. The MEMS resonator of claim 1 wherein a length of the first coupling beam is approximately equal to a minimum length permitted by a fabrication process used to fabricate the MEMS resonator.

9. The MEMS resonator of claim 1 wherein the first anchor beam is symmetrically coupled to the first connecting beam and the second anchor beam is symmetrically coupled to the second connecting beam.

10. The MEMS resonator of claim 1 further comprising:
    a second anchor coupled to the substrate, the second anchor having a third anchor point and a fourth anchor point;
    a second mechanically symmetric support structure including:
        a third beam having a first end and a second end;
        a fourth beam having a first end and a second end, and wherein the third beam is substantially parallel to the fourth beam;
        a third connecting beam extending between the first end of the third beam and the first end of the fourth beam;
        a fourth connecting beam extending between the second end of the third connecting beam and the second end of the fourth beam;
        a third anchor beam extending between the third connecting beam and the third anchor point; and
        a fourth anchor beam extending between the fourth connecting beam and the fourth anchor point; and
    a second coupling beam having a first end and a second end, wherein the first end of the second coupling beam is symmetrically coupled to the second mechanically symmetric support structure, and the second end of the second coupling beam is coupled to the resonator body.

11. The MEMS resonator of claim 10 wherein:
    the first anchor beam is symmetrically coupled to the first connecting beam;
    the second anchor beam is symmetrically coupled to the second connecting beam;
    the third anchor beam is symmetrically coupled to the third connecting beam; and
    the fourth anchor beam is symmetrically coupled to the fourth connecting beam.

12. The MEMS resonator of claim 10 wherein the length of the first beam, the second beam, the third beam, and the fourth beam are configured such that the first mechanically symmetric support structure and the second mechanically symmetric support structure vibrate in a substantially symmetric multimode.

13. The MEMS resonator of claim 10 wherein the length of the first beam, the second beam, the third beam, and the fourth beam are configured such that the first mechanically symmetric support structure and the second mechanically symmetric support structure vibrate in a substantially symmetric single mode.

14. The MEMS resonator of claim 10 wherein the first anchor point and the second anchor point of the first anchor are nodes at which there is naturally essentially no vibration when the MEMS resonator is vibrating; and
    the third anchor point and the fourth anchor point of the second anchor are nodes at which there is naturally essentially no vibration when the MEMS resonator is vibrating.

15. A Micro-Electro-Mechanical Systems (MEMS) resonator comprising:
    an anchor coupled to a substrate on which the MEMS resonator is formed;
    a resonator body; and
    a mechanically symmetric support structure acting to support the resonator body and comprising a first node coupled to the resonator body and at least one second node coupled to the anchor; and wherein the mechanically symmetric support structure is configured to, when the resonator body is vibrating, provide multimode symmetric vibration.

16. A Micro-Electro-Mechanical Systems (MEMS) resonator comprising:
an anchor coupled to a substrate on which the MEMS resonator is formed;
a resonator body; and
a support structure acting to support the resonator body and comprising a first node coupled to the resonator body and at least one second node coupled to the anchor, wherein a ratio ($k_s/k_r$) of a spring stiffness ($k_s$) of the support structure to a spring stiffness ($k_r$) of the resonator body is less than approximately 1/10.

17. A MEMS resonator comprising:
a resonator body;
a first anchor coupled to a substrate, the first anchor having a first anchor point and a second anchor point;
a second anchor coupled to the substrate, the second anchor having a first anchor point and a second anchor point;
a first mechanically symmetric support for symmetrically coupling the resonator body to the first anchor, the first mechanically symmetric support symmetrically coupled to the first anchor at the first anchor point and the second anchor point of the first anchor; and
a second mechanically symmetric support for symmetrically coupling the resonator body to the second anchor, the second mechanically symmetric support symmetrically coupled to the second anchor at the first anchor point and the second anchor point of the second anchor;
wherein:
the first mechanically symmetric support is configured to vibrate in a substantially multimode symmetric mode; and
the second mechanically symmetric support is configured to vibrate in a substantially multimode symmetric mode.

18. The MEMS resonator of claim 17 wherein the first mechanically symmetric support is configured such that the first anchor point and the second anchor point of the first anchor are substantially nodal points; and
the second mechanically symmetric support is configured such that the first anchor point and the second anchor point of the second anchor are substantially nodal points.

19. The MEMS resonator of claim 17 wherein the first mechanically symmetric support structure comprises a mechanically symmetric support selected from a group consisting of: a rectangular ring structure, a square ring structure, a circular ring structure, an oval ring structure, a hexagon structure, and an octagon structure.

20. The MEMS resonator of claim 17 wherein the first mechanically symmetric support comprises an array of two or more mechanically symmetric support components selected from a group consisting of: a rectangular ring structure, a square ring structure, a circular ring structure, an oval ring structure, a hexagon structure, and an octagon structure.

21. The MEMS resonator of claim 17 further comprising:
a first coupling beam for symmetrically coupling the resonator body to the first mechanically symmetric support; and
a second coupling beam for symmetrically coupling the resonator body to the second mechanically symmetric support.

22. The MEMS resonator of claim 21 wherein the first coupling beam and the second coupling beam are less than a quarter-wavelength value for a resonant frequency of the resonator body.

23. The MEMS resonator of claim 17 wherein the resonator body is circular.

24. The MEMS resonator of claim 17 wherein the resonator body is a solid body.

25. The MEMS resonator of claim 17 wherein the second mechanically symmetric support comprises an array of two or more mechanically symmetric support components selected from a group consisting of: a rectangular ring structure, a square ring structure, a circular ring structure, an oval ring structure, a hexagon structure, and an octagon structure.

26. A MEMS resonator comprising:
a resonator body;
a first anchor;
a first mechanically symmetric support structure including a first member having an internal edge that defines a symmetrical aperture;
wherein the first mechanically symmetric support structure is symmetrically coupled to the first anchor at a first anchor point and a second anchor point;
wherein the resonator body is coupled to the first member; and
wherein the first anchor point, and the second anchor point are nodal points.

27. The MEMS resonator of claim 26 further comprising:
a second anchor;
a second mechanically symmetric support structure including a second member having an internal edge that defines a symmetrical aperture;
wherein the second mechanically symmetric support structure is symmetrically coupled to the second anchor at a third anchor point and a fourth anchor point;
wherein the resonator body is coupled to the second member; and
wherein the third anchor point and the fourth anchor point are nodal points.

28. The MEMS resonator of claim 27 wherein the first member forms a first mechanically symmetric support component selected from a group consisting of: a rectangular ring structure, a square ring structure, a circular ring structure, an oval ring structure, a hexagon structure, and an octagon structure; and
wherein the second member forms a second mechanically symmetric support component selected from a group consisting of: a rectangular ring structure, a square ring structure, a circular ring structure, an oval ring structure, a hexagon structure, and an octagon structure.

29. The MEMS resonator of claim 26 wherein the length of the first member is configured to provide substantially multimode symmetric vibration of the first mechanically symmetric support structure.

* * * * *